(12) United States Patent
Sacks et al.

(10) Patent No.: US 6,556,933 B1
(45) Date of Patent: Apr. 29, 2003

(54) TRANSDUCER INSTABILITY DETECTION IN A DIGITAL CHANNEL

(75) Inventors: Alexei Hiram Sacks, Edina, MN (US); Timothy Francis Ellis, Tonka Bay, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 188 days.

(21) Appl. No.: 09/698,754

(22) Filed: Oct. 27, 2000

Related U.S. Application Data

(60) Provisional application No. 60/162,271, filed on Oct. 28, 1999.

(51) Int. Cl.$^7$ .............................................. G01R 31/08
(52) U.S. Cl. ..................................... 702/79; 324/76.39
(58) Field of Search .............................. 702/79, 81, 84, 702/89, 104, 182, 183, 184; 324/210, 500, 513, 522, 76.39, 76.04–42, 76.47, 76.52, 76.53

(56) References Cited

U.S. PATENT DOCUMENTS

| | | | |
|---|---|---|---|
| 5,105,192 | A | 4/1992 | Takahashi |
| 5,117,408 | A | 5/1992 | Weispfenning et al. |
| 5,189,566 | A | 2/1993 | Christensen et al. |
| 5,337,264 | A | 8/1994 | Levien |
| 5,384,552 | A | 1/1995 | Iwasaki |
| 5,420,888 | A | 5/1995 | Davis et al. |
| 5,424,638 | A | 6/1995 | Huber |
| 5,430,768 | A | 7/1995 | Minuhin et al. |
| 5,459,757 | A | 10/1995 | Minuhin et al. |
| 5,557,482 | A | 9/1996 | Christensen et al. |
| 5,586,144 | A | 12/1996 | Kahlman et al. |
| 5,625,508 | A | 4/1997 | Brown et al. |
| 5,638,225 | A | 6/1997 | Tsuboi et al. |
| 5,650,954 | A | 7/1997 | Minuhin |
| 5,675,565 | A | 10/1997 | Taguchi et al. |
| 5,677,802 | A | 10/1997 | Saiki et al. |
| 5,822,147 | A | 10/1998 | Kisaka |
| 5,831,787 | A | 11/1998 | Yoshida et al. |
| 5,854,717 | A | 12/1998 | Minuhin |
| 5,872,959 | A | 2/1999 | Nguyen et al. |
| 5,892,631 | A | 4/1999 | Howell et al. |
| 5,914,594 | A | 6/1999 | Mian |
| 5,969,894 | A | 10/1999 | Howell et al. |
| 6,025,712 | A | 2/2000 | Mian |
| 6,249,393 | B1 * | 6/2001 | Billings et al. ............... 360/31 |

FOREIGN PATENT DOCUMENTS

WO   WO 99/12167   3/1999

\* cited by examiner

*Primary Examiner*—Marc S. Hoff
*Assistant Examiner*—Edward Raymond
(74) *Attorney, Agent, or Firm*—Kirk A. Cesari

(57) ABSTRACT

A data handling system that effectively detects and diagnoses manifestations of excessive transducer instability. For example, some embodiments identify shouldering and baseline pop instabilities in a digital servo channel.

A preferred method of the present invention involves detecting a precise time at which a first feature in the received signal is encountered. Then, after a preset delay, a first level of the received signal is sampled. Then, after waiting until after a second feature in the received signal occurs, a second level of the received signal is sampled. Finally, at least one digital signal is generated so as to indicate whether an arithmetic combination of the first and second levels falls outside a stability-indicative range.

A preferred device of the present invention includes a transducer, a peak detector configured to receive a signal from the transducer, two delay elements, two sampling circuits, and an output.

19 Claims, 5 Drawing Sheets

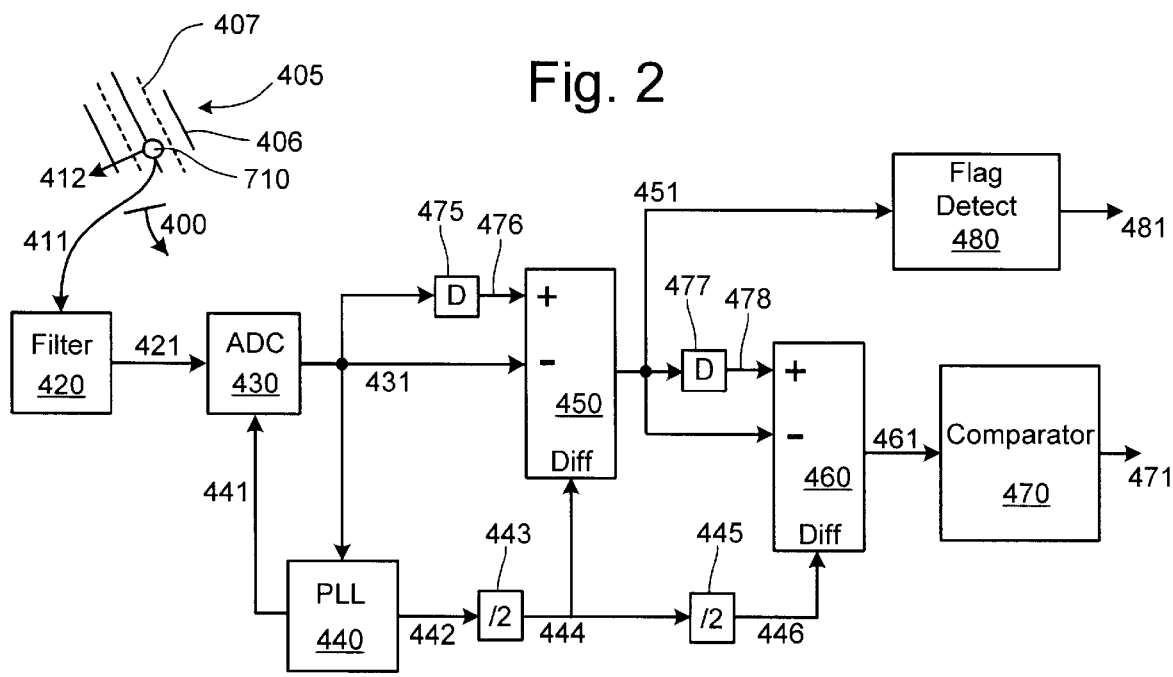
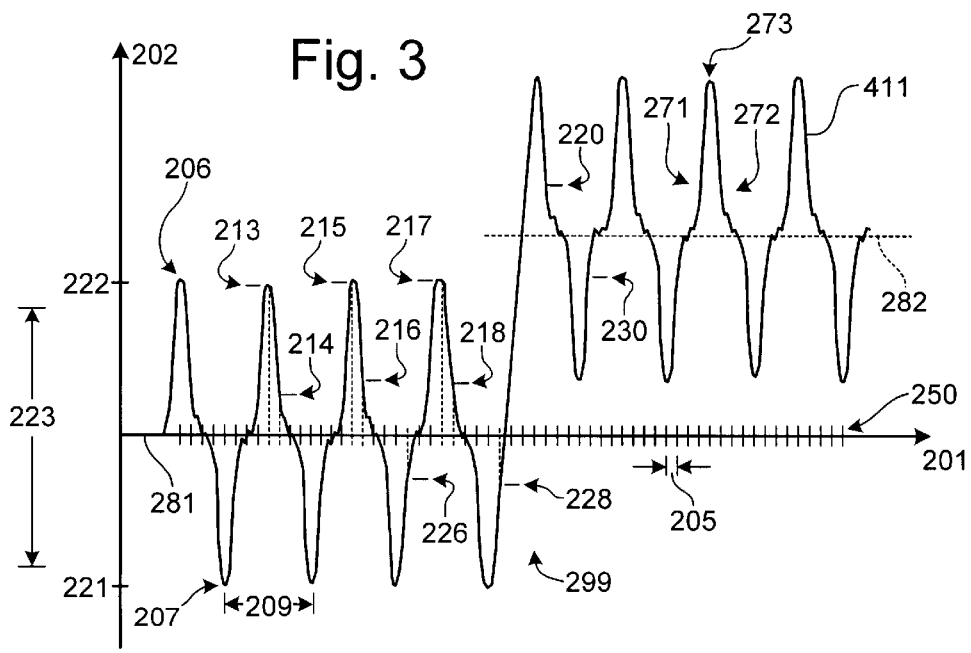

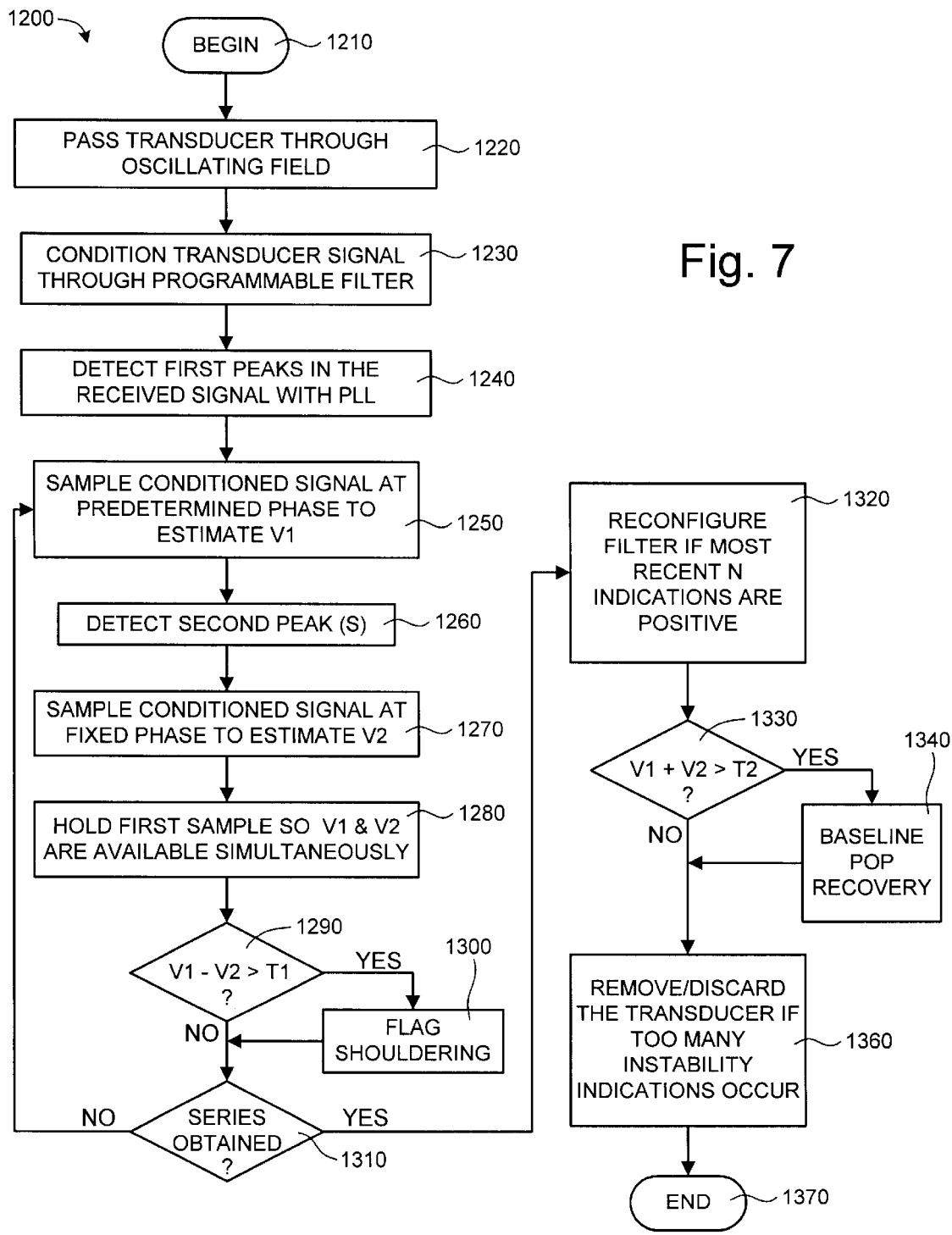

TRANSDUCER INSTABILITY DETECTION IN A DIGITAL CHANNEL

RELATED APPLICATIONS

This application claims the benefit of U.S. Provisional Application No. 60/162,271 filed on Oct. 28, 1999.

FIELD OF THE INVENTION

The present invention relates to component monitoring systems, and more particular to systems for monitoring the stability of high performance transducers such as those employed in information handling systems.

BACKGROUND OF THE INVENTION

Information handling systems have undergone explosive growth over the past several years. New technologies are allowing today's common components to outperform state-of-the-art components of five years ago. In disc drives, for example, areal density has doubled each year for the past several years. This has been made possible, in part, by the development of better magnetic transducers than previously existed. Not surprisingly, most modern transducers are highly sophisticated and temperamental.

Modern hard disc drives comprise one or more rigid discs that are coated with a magnetizable medium and mounted on the hub of a spindle motor for rotation at a constant high speed. Information is stored on the discs in a plurality of concentric circular tracks by an array of transducers mounted to a radial actuator for movement of the transducers relative to the discs. Typically, such radial actuators employ a voice coil motor to position the transducers with respect to the disc surfaces. Sliders carrying the transducers are mounted via flexures at the ends of a plurality of arms which project radially outward from a substantially cylindrical actuator body. The actuator body pivots about a shaft mounted to the housing at a position closely adjacent the outer extreme of the discs. The pivot shaft is parallel with the axis of rotation of the spindle motor and the discs, so that the transducers each move in a respective plane parallel with the surfaces of the discs.

The actuator voice coil motor includes a coil mounted on the side of the actuator body opposite the transducer arms so as to be immersed in the magnetic field of an array of permanent magnets. When controlled DC current is passed through the coil, an electromagnetic field is set up which interacts with the magnetic field of the magnets and causes the coil to move in accordance with the well-known Lorenz relationship. As the coil moves relative to the magnets, the actuator body pivots about the pivot shaft and the transducers are moved across the disc surfaces.

Typically, the transducers are supported over the discs by actuator slider assemblies which include air-bearing surfaces designed to interact with a thin layer of moving air generated by the rotation of the discs, so that the transducers are said to "fly" over the disc surfaces. Generally, the transducers write data to a selected data track on the disc surface by selectively magnetizing portions of the data track through the application of a time-varying write current to the transducer. In order to subsequently read back the data stored on the data track, the transducer detects flux transitions in the magnetic fields of data track and converts these to a signal which is decoded by read channel circuitry of the disc drive.

Most high-performance disc drives use magneto-resistive (MR) transducers, which typically comprise one or two thin strips of ferromagnetic material such as NiFe magnetized along an easy axis of low coercivity. The strips are mounted in the transducer such that the easy axis is transverse to the direction of disc rotation and parallel to the plane of the disc. Magnetic flux from the disc surface causes rotation of the magnetization vector of the strip, which in turn causes a change in electrical resistivity. A sense current is passed through the thin strip and the magnetic flux can be detected by measuring the change in voltage across the element as a result of the changing resistivity.

As with any mass-produced component, a nominal amount of variation in the width of transducers is typically present as a result of tolerances inherent in large-scale manufacturing. As a result of these variances and irregularities in materials used, subtle and often intermittent performance problems can occur. In a disc drive, moreover, variations in baseline level may also be caused by gross fly-height issues, media problems, or the use of topography on the disc surface (servo patterned or bit patterned media).

Current magnetic read sensors often exhibit "instability," in the sense that the "readback" transducer signal can exhibit random fluctuating behavior that can make the detection of both servo and user data extremely difficult. For example, either pulse "shouldering" (asymmetry) or baseline pop/shift can cause significant problems in demodulating the readback signal.

Existing methods of detecting an unstable behavior may not permit cost-effective diagnosis of such instability. This can cause a slow or inappropriate response, wasting an opportunity in cases where an effective response is available. Thus, there is a need for a more effective approach to diagnosing and responding to an unstable behavior.

SUMMARY OF THE INVENTION

The present invention is used in a data handling system that effectively detects and diagnoses manifestations of excessive transducer instability. For example, some embodiments of this invention identify shouldering and baseline pop instabilities in a digital servo channel. This is important since integration of the servo and read/write channels into a disc drive typically means the use of all digital channels.

A preferred method of the present invention involves detecting a precise time at which a first feature in the received signal is encountered. Then, after a preset delay, a first level of the received signal is sampled. Then, after waiting until after a second feature in the received signal occurs, a second level of the received signal is sampled. Finally, at least one digital signal is generated so as to indicate whether an arithmetic combination of the first and second levels falls outside a stability-indicative range.

A preferred device of the present invention includes a transducer, a peak detector configured to receive a signal from the transducer, two delay elements, two sampling circuits, and an output. One delay element is configured to generate a first sampling signal a predetermined time after a first peak is detected. The other delay element is configured to generate a second sampling signal a predetermined time after a second peak. One of the sampling circuits responds to each of these delay elements to extract a respective sample level from the transducer signal. The output generates a first digital signal indicative of whether a first arithmetic combination of the first and second levels falls outside a stability-indicative range.

Other features and advantages of the present invention will become apparent upon a review of the following figures and their accompanying description.

BRIEF DESCRIPTION OF THE DRAWINGS

FIG. 2 shows novel features of monitoring circuitry residing on the preamp and/or controller board of the data storage system of FIG. 1.

FIG. 3 shows the amplitude of the readback signal of FIG. 2 as a function of time.

FIG. 7 shows a method of the present invention in flowchart form.

DETAILED DESCRIPTION

Figure 1:
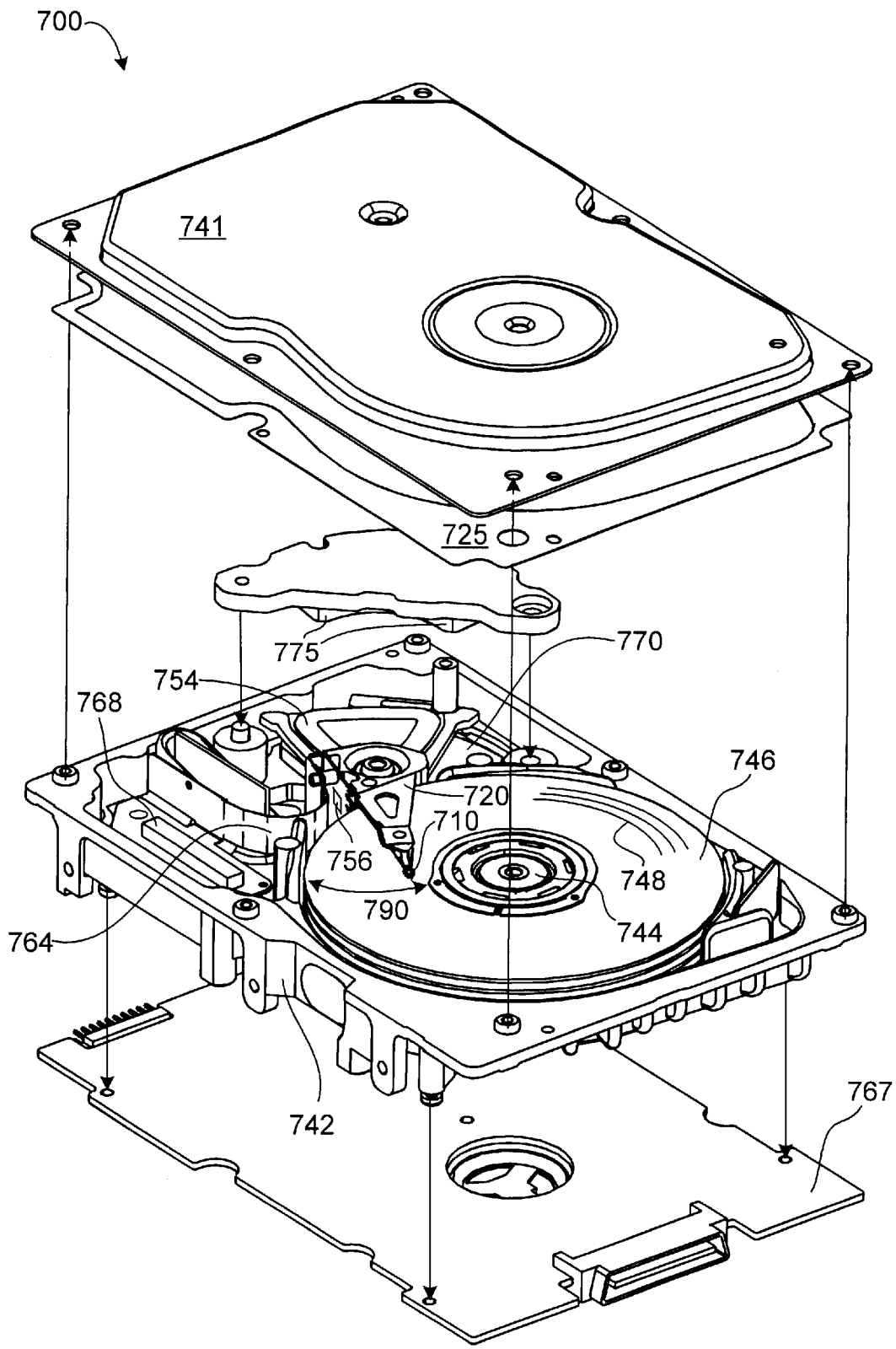
FIG. 1 shows a data storage system incorporating the present invention.

Numerous aspects of component monitoring and disc drive design that are not a part of the present invention, or are well known in the art, are omitted for brevity. These include specifics of how to configure a digital filter and how to perform a baseline pop recovery routine. Although each of the many examples below shows more than enough detail to allow those skilled in the art to practice the present invention, subject matter regarded as the invention is broader than any single example below. The scope of the present invention is distinctly defined, however, in the claims at the end of this document.

Where practical, features shown in the figures are drawn to scale. Like reference numerals refer to like elements, throughout the following figures and descriptions. Definitions of certain terms are provided in conjunction with the figures, all consistent with common usage in the art but some described with greater specificity. For example, a numerical "range," as used herein, refers to a contiguous one-dimensional block of values. Note, however, that one boundary of the range may have infinite magnitude. Thus, a minimum value can fully define a range. Except as noted, all quantitative and qualitative descriptors employ their broadest meaning consistent with industry usage.

FIG. 1 shows a data storage system 700 incorporating the present invention, including rotatable actuator assembly 720. System 700 also includes base 742 and top cover 741, which both engage gasket 725 to form a sealed housing that maintains the clean environment inside the system 700. Several discs 746 are mounted for rotation on spindle motor hub 744. Each disc 746 has two horizontal surfaces. Several transducers 710 are mounted on actuator assembly 720. As depicted, transducers 710 are loaded onto annular data tracks 748 of discs 746. The actuator assembly 720 is adapted for pivotal motion under control of a voice coil motor (VCM) comprising voice coil 754 and voice coil magnets 770,775 to controllably move transducers 710 each to a respective desired track 748 along an arcuate path 790. Arcuate path 790 crosses several thousand data tracks 748 between the two extremes of its stroke. As the discs 746 rotate, transducers 710 transmit electrical signals related to the strength of the magnetic field adjacent each moving surface of each disc 746. Preamplifier 756 amplifies the signals, which carry positional and user data, so that they can pass via a flex circuit 764 and a connector 768 to electronic circuitry on the controller board 767.

FIG. 2 shows novel features of monitoring circuitry 400 residing on preamp 756 and/or controller board 767, an embodiment using a minimum of hardware and providing for maximum dynamic range. Transducer 710 is in motion relative to magnetic field 405 in a direction 412 such that the transducer encounters alternating magnetic field transitions 406,407. Note that transitions 406,407 are major transitions, readily distinguishable by their magnitude from minor field fluctuations that may appear in the readback signal 411. As explained below with reference to FIG. 7, a preferred method of the present invention uses a readback signal 411 obtained while a transducer 710 is adjacent transitions 406,407 occurring at regular intervals so that the readback signal 411 is substantially periodic. Programmable filter 420 conditions the readback signal 411 so as to minimize distortion in filtered signal 421, which then enters an analog to digital converter (ADC) 430. ADC output signal 431 is then provided to inputs of delay element 475, difference block 450, and phase-locked loop (PLL) 440.

ADC output signal 431 carries several digitized samples to PLL 440 each cycle (i.e. for each pair of primary field transitions 406,407). PLL 440 provides a feedback signal 441 to ADC 430 so that the digitized samples carried in ADC output signal 431 maintain a substantially fixed phase relationship within each period of readback signal 411. PLL 440 also provides synchronous signal 442 to frequency divider 443 so that the PLL output 442 has one cycle per field transition 406,407. Divider output signal 444 has one cycle per two field transitions 406,407. The operation of the remainder of the monitoring circuit 400 will be explained with reference to specific segments of readback signal 411 depicted at FIGS. 3 & 4.

FIG. 3 shows the amplitude 202 of readback signal 411 over a period of time 201. Oppositely-directed, successive magnetic transitions 406,407 each cause a corresponding positive or negative signal peak 206,207. Signal 411 exhibits a baseline shift 299 in which readback signal 411 transitions from a first baseline 281 to a second baseline 282, manifesting an unstable behavior of transducer 710. At several times 250 per period 209 of readback signal 411, sample levels 213,214 of the readback signal are obtained. As shown, the sample times 250 have a stable, uniform interval 205. In the present case, a near-peak level 213,215,217 marks the beginning of each cycle, and each cycle of readback signal 411 has eight sample intervals 205. In the present example it can be seen that sample level 216 is slightly higher than the preceding, corresponding sample level 214 of the previous cycle. PLL 240 responds by incrementally increasing sample interval 205 so that a subsequent corresponding sample level 218 is lower than it otherwise would have been.

Referring again to FIG. 2, delay element 475 delays ADC output signal 431 by about half a sample period 209 so that sample level 216 is provided to the + input of difference block 450 while sample level 226 is provided to the − input. Note that samples passing through difference block 450 are alternatingly on the increasing side 271 and the decreasing side 272 of the values of readback signal 411 at each successive triggering event of difference block 450. Each side 271,272 is essentially monotonic and is adjacent to primary peak 273.

In response to the series of triggered levels 216,226,218, 228,220,230, difference output 451 will generate alternating negative and positive values having a magnitude about equal to the difference between level 218 and level 228. In response to the baseline shift 299, difference output 451 will have a large negative value (i.e. level 228 minus level 220). In one cycle (triggered by output 446 from frequency divider 445), this large negative pulse is subtracted from a previous value (at output 478 of delay element 477). Note that frequency dividers 443,445 should include enough delay to allow for setup time of the newly sampled values.

A large positive pulse is consequently generated at the output 461 of difference block 460. In the next cycle, a new value (at the negative input of difference block 460) is subtracted from the large negative value (at the positive input), causing a large negative pulse to appear at output 461. Thereafter, a series of moderate values are received into comparator 470. The combination of delay element 477, difference block 460, and frequency divider 445 thus permit positive and negative aberrations to be detected (as a pulse on output 471) by a comparison with a single threshold 221,222 rather than a range.

In circuitry 400, it can thus be seen that a pulse at the output 471 of comparator 470 is an indicator of a sudden, substantial baseline shift (i.e. baseline pop). It can likewise be seen that pulses at the output 451 of difference block 450 suggest instances of shouldering instability. In a preferred embodiment, flag detect circuit 480 generates a pulse at its output 481 whenever several successive indications of excessive shouldering appear at output 451.

Comparator 470 and flag detect circuitry 480 use thresholds that should be selected so as to avoid false indications of instability. In the present case, the magnitudes pulses seen at output 451 exceed 10% of magnitude of signal 411 (measured peak 222 to peak 221) before the baseline shift 299. Thus, the stability-indicative range 223 within which these values are expected to remain (in the absence of instability) is quite large. The sensitivity of the present circuitry can be enhanced if predetermined phases for sample times are selected so as to be near a baseline 281 (i.e. within about 5% of the peak 222 to peak 221 magnitude of signal 411) in the absence of shouldering. This allows for the size of the stability-indicative range 223 to be reduced.

Figure 4:
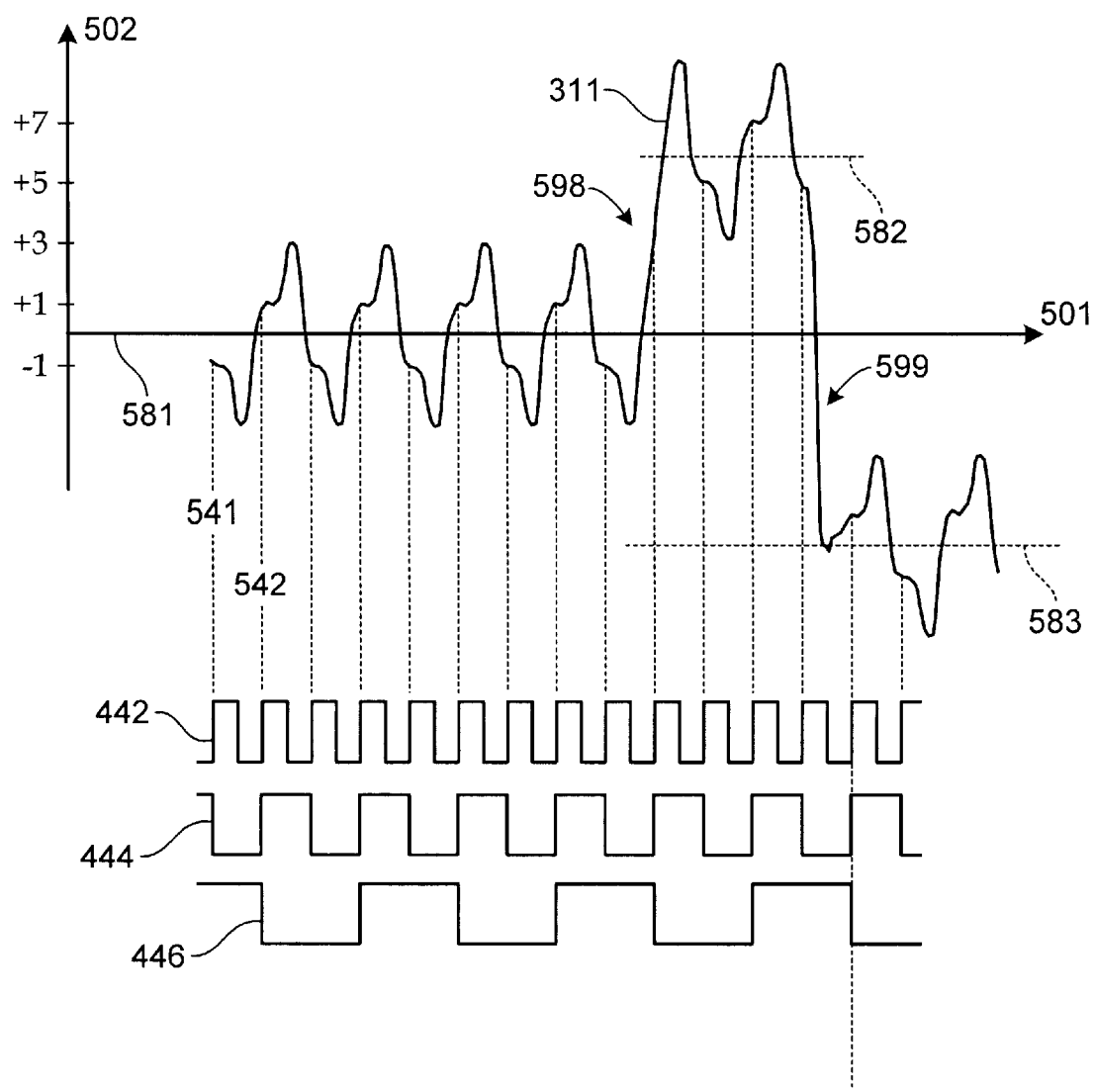
FIG. 4 shows the amplitude of another transducer signal over a period of time, and also shows how the circuitry of FIG. 2 would respond to the signal.

FIG. 4 shows the amplitude 502 of another transducer signal 311 over a period of time 501. In the depicted period, signal 311 suffers baseline pop events 598,599 from first baseline 581 to other baseline 582,583 manifesting an unstable behavior in a transducer 310 (see FIG. 5). FIG. 4 also includes waveforms of output signals 442,444,446 that would be generated if signal 311 were used as signal 411 and provided to monitoring circuit 400 (see FIG. 2). The sample times 541,542 have been selected so that, absent baseline shift or shouldering, the sample level obtained would be very small (i.e. less than 1% of the peak-to-peak magnitude of signal 311). The depicted shouldering is much larger than that, a manifestation of instability. Amplitude values as shown will result in shouldering values (i.e. like those seen at output 451) alternating between +2 and −2.

Figure 5:
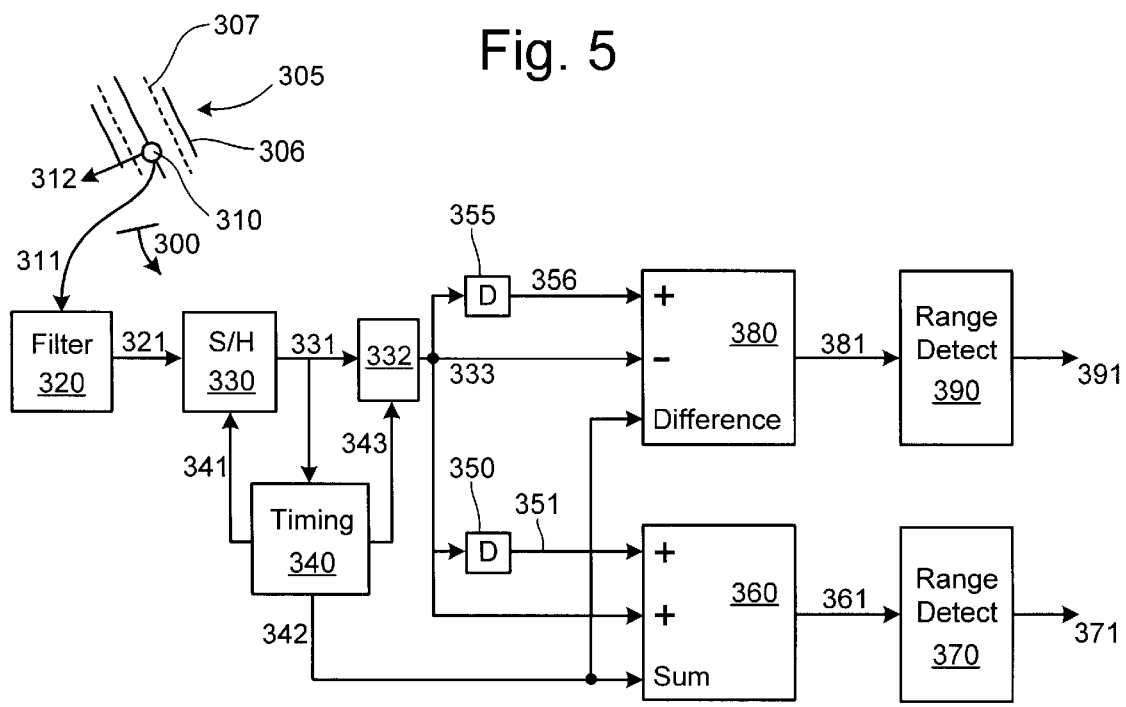
FIG. 5 shows another monitoring circuit of the present invention, one that need not have periodic transitions.

FIG. 5 shows another transducer 310 providing a signal 311 to a monitoring circuit. Transducer 310 is in motion relative to magnetic field 305 in a direction 312 such that the transducer encounters alternating magnetic field transitions 306,307. Transducer signal 312 is first conditioned by filter 320, which selectively reduces distortion in filtered signal 321 which then enters sample and hold circuit (S/H) 330. S/H output signal 431 is then provided to inputs of delay element 475, difference block 450, and phase-locked loop (PLL) 440. S/H output 331 is processed by a timing circuit 340 to generate and S/H feedback signal 341 and a trigger signal 342, which can operate like the PLL 440 of FIG. 2. Averaging circuit 332 generates an output 333 from sets of sample values in output 331 (see FIG. 6), resetting each time a peak is encountered (via reset 343). Trigger signal 342 causes summation block 360 and difference block 380 to perform their respective operations once per cycle. Each cycle, an average of the output is subtracted from its predecessor (i.e. output 356 of delay element 355), and the result is provided at output 381. Consequently, a digital signal 391 indicates whether the difference output 381 is outside its respective stability-indicative range. Each cycle, an average of the output is also added to its predecessor (i.e. output 351 of delay element 350), and the result is provided at output 361. Consequently, a digital signal 371 of range detect circuit 370 indicates whether the difference output 361 is outside its respective stability-indicative range.

Figure 6:
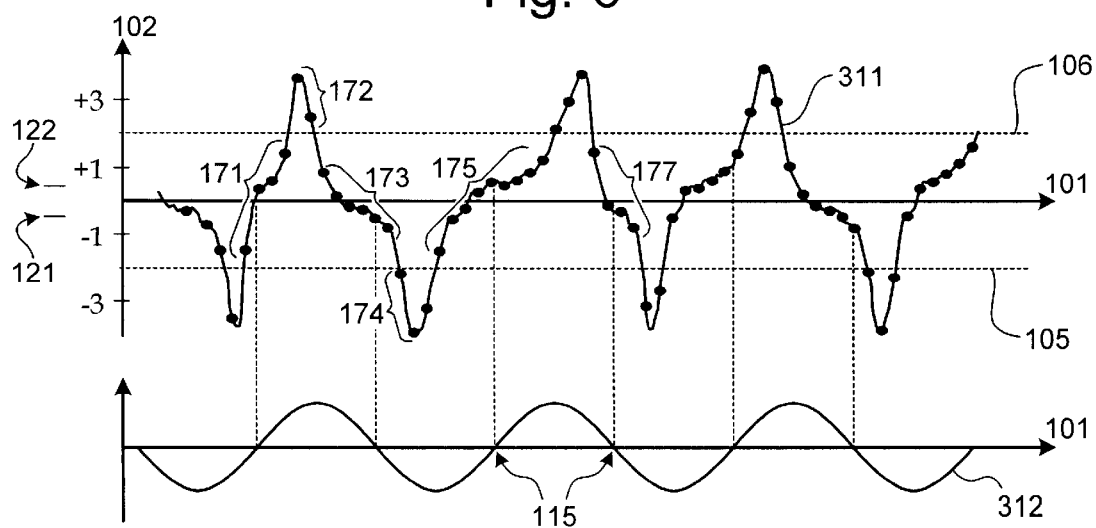
FIG. 6 shows the amplitude of a signal from the transducer of FIG. 5.

FIG. 6 shows the amplitude 102 of transducer signal 311 over a period of time 101, including values of several sets of samples 171,172,173,174,175. When timing circuit 340 receives a sample 172 above a predetermined maximum 106, it causes averaging circuit 332 to be reset. Several values of samples 173 are averaged. When a sample 174 is received that is below a predetermined minimum, reset 343 causes averaging circuit to finalize and transmit the result, and to reset the averaging circuit to receive new sample values. Each sample 173 is rounded to the nearest odd integer (a very coarse resolution for simplicity), so output 333 indicates a result of −0.33 as the average value of the samples 173. The next samples 175 similarly cause output 333 to indicate a result of +0.33. The complete series of values of output 333 for the depicted portion of signal 311 is (+1/2, −1/3, +1/3, −1/2, +2/3, −1/3, +2/3). These values cause output 361 to generate values of (+1/6, 0, −1/6, +1/3, +1/3) and output 381 to generate values of (+5/6, −2/3, +5/6, −1, +1). The amount of baseline shift instability present during this period is acceptable, and so a range comprising a minimum 121 of about −1/2 and a maximum 122 of about +1/2 will be appropriate if these samples are representative. A large majority of in-range sample points 171,173,175,177 appear to be below the baseline during intervals where transducer signal decreases, however, and vice versa. This suggests shouldering instability. A shouldering minimum or maximum having a magnitude less than 1 is desirable, therefore, in this example.

A preferred method of the present invention includes a step of generating a transducer signal 311 that is substantially periodic. To avoid the complexity of combining multiple samples, however, another method involves using a timing circuit that uses a narrow pass filter to extract a sinusoidal component 312 of the transducer signal 311. This simplifies the timing circuit by providing highly periodic features, suitable for a PLL to maintain a meaningful fixed-phase relationship. In this event, averaging circuit 332 may be omitted.

FIG. 7 shows a method of the present invention, best suited for iterative execution, comprising steps 1210 through 1370. Time-varying magnetic fields affect a transducer 1220 to generate a transducer signal, which is then conditioned through a programmable filter 1230. A PLL is used to detect "first" peaks in the filtered signal 1240, generating a timing signal having a fixed phase relationship with the filtered signal or one of its sinusoidal components. With this timing signal, the conditioned signal is sampled at a predetermined phase, measuring the filtered signal value V1 at that phase 1250.

After detecting at least one more peak 1260, the filtered signal value V2 at a second phase is measured 1270. A delay or holding circuit preserves the value of V1 so that it is available simultaneously with V2 1280. The difference between the measured values V1 and V2 is compared against a threshold T1 1290 (T1 being a threshold correlated with instability). A flag is recorded to indicate whether the difference suggests a shouldering instability 1300. By iteratively performing steps 1250 through 1300, a series of at least N flag values is obtained 1310. If all N flag values are positive, the filter is reconfigured 1320 to reduce a shouldering instability. The series is retained so that, when method 1200 is performed again, steps 1250 through 1300 need only be performed once to obtain an updated series.

Next, a sum of V1 and V2 is compared against another threshold T2 1330. If the sum falls outside a stability-indicative range, a baseline pop recovery procedure is executed 1340. This may include altering a current passing through the transducer, adjusting the programmable filter or the threshold values (T1,T2), or passing the transducer through another field having known properties. In accordance with preferred embodiments, a typical data handling system will perform one of these baseline pop recovery procedures in any of several circumstances where it is warranted, not only when threshold T2 is exceeded. Finally, the times of recent reconfiguration or recovery attempts is recorded. The transducer is discarded or removed from use if any monitoring signal 471,481 too frequently suggest that the transducer is unstable 1360.

Alternately characterized, a first embodiment of the present invention is a data handling system comprising a semi-stable transducer and any of several means for responding to an indication that a signal received from the semi-stable transducer exhibits an unstable behavior. For example, a preferred data handling system includes a phase or peak detector 340,440 configured to receive a signal from a transducer 310,710. A first delay element 350,355,477 responds to a signal from the peak detector 340,440 so as to generate a first sampling signal 351,356,478 a predetermined time after the peak detector detects a first peak 206. A second delay element also responds to a signal from the peak detector 340,440 so as to generate a second sampling signal 333,451 a predetermined time after a second peak 207. First and second circuits (inputs to accumulator blocks 360,380,460) are configured to acquire a first and second sample levels in the transducer signal in immediate response to the first and second sampling signals, respectively. Also, a first output generates a first digital signal 371,391,471 indicative of whether a first arithmetic combination of the first and second levels falls outside a stability-indicative range 121,122,223.

A second embodiment of the present invention is a method of monitoring a signal 311,411 received from a semi-stable transducer 310,710. A precise measure of time (e.g. 4 times sample interval 205) after triggering from a precise time 250 at which a first feature 115,216 is encountered, a first level 218 of the received signal 411 is sampled 1250. After waiting until after a second feature in the received signal occurs (optionally by sensing a feature such as a peak 206, and then by waiting a known delay), a second level 228 of the received signal 411 is sampled. A digital signal 471,481 indicates whether a first arithmetic combination 451,461 of the first and second levels 218,228 falls outside a stability-indicative range 223. Preferably, the first and second levels that are combined are sampled from adjacent, essentially monotonic portions 271,272 of a waveform that are both adjacent to the same primary peak 273.

In a basic version of the method, transducer 710 passes through a magnetic field 405 having transitions 406,407 at regular intervals so that the signal 411 received from the transducer is substantially periodic. In this version, the stability-indicative range is derived as a minimum 221 and maximum 222 approximating the lowest negative peak and highest positive peak of the received signal 411. The arithmetic combination is a simple sum 361, difference 381, weighted combination, or similar real-world signal accumulation. One or more signals is generated so as to signal that a baseline pop 299 has occurred if the sum 361 falls outside the range 121,122 and otherwise generally signaling that a baseline pop 299 has not occurred 1330. In another version of the method, where peaks are not periodic, a stable sinusoidal component 312 of the received signal 311 can nevertheless be extracted. This allows delays to be implemented cheaply and precisely with a PLL.

In a third embodiment of the present invention, a readback signal 411 is input to the detection circuitry 400. The signal passes through programmable filter 420 which is set to predetermined conditions. PLL 440 extracts a stable sinusoidal component 312 of the received signal and determines the phase of the ADC output 431 and of the triggering of the difference blocks 450,460. ADC 430 samples the filtered input signal based on a sample clock generated by PLL 440. The sampled signal is passed through a delay element (as signal 476) and into difference block 450. Non-delayed sampled signal 431 is also passed into difference block 450. If the output 451 of difference block 450 exceeds a preset level, or if its profile changes, it can trip a flag provided directly to the system if the amount of shouldering. Similarly, an output 461 from difference block 460 indicates the presence or absence of baseline pop. Comparator 470 provides a warning flag directly to the system if the amount of baseline shift or pop exceeds a preset level.

All of the structures described above will be understood to one of ordinary skill in the art, and would enable the practice of the present invention without undue experimentation. It is to be understood that even though numerous characteristics and advantages of various embodiments of the present invention have been set forth in the foregoing description, together with details of the structure and function of various embodiments of the invention, this disclosure is illustrative only. Changes may be made in the details, especially in matters of structure and arrangement of parts within the principles of the present invention to the full extent indicated by the broad general meaning of the terms in which the appended claims are expressed. For example, the particular elements may vary depending on the particular application for the present system while maintaining substantially the same functionality, without departing from the scope and spirit of the present invention. In addition, although the preferred embodiments described herein are largely directed to transducers in disc drives, it will be appreciated by those skilled in the art that the teachings of the present invention can be applied to antennas and the like without departing from the scope and spirit of the present invention.

What is claimed is:

1. A method of monitoring a signal received from a semi-stable transducer comprising steps of:
    (a) detecting a precise time at which a first feature in the received signal is encountered;
    (b) waiting a predetermined delay upon completing detecting step (a);
    (c) sampling a first level of the received signal upon completing waiting step (b);
    (d) after sampling step (c), waiting until after a second feature in the received signal occurs;
    (e) sampling a second level of the received signal after waiting step (d); and
    (f) generating a first digital signal indicative of whether a first arithmetic combination of the first and second levels falls outside a stability-indicative range.

2. The monitoring method of claim 1 in which step (f) includes steps of:
    (f1) deriving the stability-indicative range as a minimum and maximum approximating the lowest negative peak and highest positive peak of the received signal;

(f2) deriving the arithmetic combination as a sum of the first and second levels; and (f3) via the digital signal, signaling that a baseline pop has occurred if the sum falls outside the range and otherwise generally signaling that a baseline pop has not occurred.

3. The monitoring method of claim 1 in which the second feature is a peak, and in which the waiting step (d) includes steps of:

(d1) detecting the peak; and (d2) waiting a predetermined delay after the peak.

4. The monitoring method of claim 1 further comprising a step (g) of passing the semi-stable transducer through a magnetic field having transitions at regular intervals so that the signal received from the transducer is substantially periodic.

5. The monitoring method of claim 1 in which the first and second features are each a local peak of a sinusoidal component of the received signal, and in which the waiting step (d) includes steps of:

(d1) using a phase locked loop to establish a series of delays having a substantially fixed phase relationship to the sinusoidal component; and (d2) using a selected one of the series of delays to wait until after the second feature in the received signal is expected to have occurred.

6. The monitoring method of claim 1 further comprising a step (g) of changing a steady-state current passing through the transducer substantially if an external signal derived from the digital signal suggests that the transducer is operating inconsistently and otherwise generally not changing the steady-state current passing through the transducer substantially.

7. The monitoring method of claim 1 further comprising a step (g) of retaining the transducer if an external signal derived from the digital signal suggests that the transducer is acceptable and otherwise generally not retaining the transducer.

8. The monitoring method of claim 1 further comprising a step (g) of conditioning the received signal through a programmable filter set to predetermined conditions.

9. The monitoring method of claim 8 further comprising a step (h) of adjusting the programmable filter if an external signal derived from the digital signal suggests an instability and otherwise generally not adjusting the programmable filter.

10. The monitoring method of claim 1 in which step (f) includes steps of:

(f1) delaying a signal containing the first sample level so that the first sample and second sample levels are available simultaneously;

(f2) passing both signals into an accumulator; and (f3) receiving the arithmetic combination as an output of the accumulator.

11. The monitoring method of claim 1 in which the arithmetic combination is a sum, and in which the external signal suggests a baseline pop instability.

12. The monitoring method of claim 1 in which the external signal suggests a shouldering instability, further including a step (g) of generating a second digital signal indicative of whether a second arithmetic combination of the first and second levels falls outside a stability-indicative range.

13. The monitoring method of claim 1 further comprising steps of:

(g) repeating steps (a) through (f) several times; and (h) generating an external signal indicative of whether the arithmetic combination falls outside a stability-indicative range on several successive instances of step (f).

14. The monitoring method of claim 13 in which the arithmetic combination is a difference, and in which the external signal suggests a shouldering instability.

15. The monitoring method of claim 1 further comprising a step (g) of performing a baseline pop recovery procedure if the combination falls outside the stability-indicative range and otherwise generally not performing a baseline pop recovery procedure.

16. The monitoring method of claim 1 further comprising steps of:

(g) passing the semi-stable transducer through a magnetic field having transitions at regular intervals so that the signal received from the transducer is substantially periodic;

(h) conditioning the readback signal through a programmable filter set to predetermined conditions;

(i) based on the digital signal, generating an update signal that is generally positive if the arithmetic combination falls outside the stability-indicative range and that is otherwise generally negative;

(j) changing a steady-state current passing through the transducer substantially if the update signal is positive and otherwise generally not changing the steady-state current passing through the transducer substantially; and (k) adjusting the programmable filter if the update signal is positive and otherwise generally not adjusting the programmable filter.

17. The monitoring method of claim 1 in which step (f) includes steps of:

(f1) deriving the stability-indicative range as a minimum and maximum approximating the lowest negative peak and highest positive peak of the received signal;

(f2) deriving the arithmetic combination as a sum of the first and second levels; and (f3) via the digital signal, signaling that a baseline pop has occurred if the sum falls outside the range and otherwise generally signaling that a baseline pop has not occurred;

the method further comprising steps of:

(g) repeating steps (a) through (f);

(h) generating a first external signal indicative of whether the first arithmetic combination falls outside a stability-indicative range on any two successive instances of step (f);

(i) performing a baseline pop recovery procedure if the first external signal is positive and otherwise generally not performing a baseline pop recovery procedure;

(j) generating a second external signal indicative of whether a second arithmetic combination of the first and second levels falls outside an acceptable range;

(k) repeating steps (g) through (j); and (l) accepting the transducer if the second external signal suggests that the transducer is acceptable and otherwise generally discarding the transducer.

18. A data handling system comprising:

(a) a transducer configured to transmit a transducer signal;

(b) a peak detector configured to receive the transducer signal;

(c) a first delay element responsive to the peak detector so as to generate a first sampling signal a predetermined time after the peak detector detects a first peak;

(d) a second delay element responsive to the peak detector so as to generate a second sampling signal a predetermined time after a second peak;

(e) first and second circuits configured to acquire a first and second sample levels in the transducer signal in immediate response to the first and second sampling signals, respectively; and (f) a first output generating a first digital signal indicative of whether a first arithmetic combination of the first and second levels falls outside a stability-indicative range.

19. A data handling system comprising:

a semi-stable transducer; and means for responding to an indication that a signal received from the semi-stable transducer exhibits an unstable behavior.

* * * * *